(12) United States Patent
Soda

(10) Patent No.: US 6,636,105 B2
(45) Date of Patent: Oct. 21, 2003

(54) SEMICONDUCTOR DEVICE, A CHARGE PUMP CIRCUIT AND A PLL CIRCUIT THAT CAN SUPPRESS A SWITCHING NOISE

(75) Inventor: Masaaki Soda, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/915,725

(22) Filed: Jul. 26, 2001

(65) Prior Publication Data

US 2002/0017935 A1 Feb. 14, 2002

(30) Foreign Application Priority Data

Jul. 28, 2000 (JP) ..................... 2000/229335

(51) Int. Cl.[7] .................................. H03K 5/22
(52) U.S. Cl. ..................... 327/537; 327/157
(58) Field of Search ..................... 327/157, 535, 327/537, 156, 437

(56) References Cited

U.S. PATENT DOCUMENTS

| | | | |
|---|---|---|---|
| 4,847,519 A | 7/1989 | Wahl et al. | 327/536 |
| 5,212,456 A | 5/1993 | Kovalcik et al. | 327/534 |
| 5,473,283 A * | 12/1995 | Luich | 327/157 |
| 6,229,345 B1 * | 5/2001 | Kirkland et al. | 327/65 |
| 6,236,269 B1 | 5/2001 | Hojabri | 330/253 |
| 6,292,061 B1 * | 9/2001 | Qu | 327/157 |

FOREIGN PATENT DOCUMENTS

| | | | |
|---|---|---|---|
| JP | H08-130465 | 5/1996 | H03L/7/093 |
| JP | H10-190455 | 7/1998 | H03L/7/093 |
| JP | H11-225069 | 8/1999 | H03L/7/093 |
| JP | 11-339463 | 12/1999 | G11C/5/14 |
| JP | 2000-49596 | 2/2000 | H03L/7/093 |
| JP | 2000-175441 | 6/2000 | |

* cited by examiner

Primary Examiner—Dinh T. Le
(74) Attorney, Agent, or Firm—Hayes Soloway P.C.

(57) ABSTRACT

A semiconductor device includes first and second output stage transistors, and a first transistor, and a first constant current source, and a first specific transistor, and a second transistor, and a second constant current source and a second specific transistor. The first and second output stage transistors generate an output signal as a result of a push-pull operation, which are mutually connected in series between a first power supply and a second power supply. The first transistor has a control electrode, to which a first input signal is inputted, and is connected between the first power supply and the second power supply. The second transistor has a control electrode, to which a second input signal is inputted, and is connected between the first power supply and the second power supply.

10 Claims, 5 Drawing Sheets

SEMICONDUCTOR DEVICE, A CHARGE PUMP CIRCUIT AND A PLL CIRCUIT THAT CAN SUPPRESS A SWITCHING NOISE

BACKGROUND OF THE INVENTION

1. Field of the Invention

The present invention relates to a semiconductor device, a charge pump circuit and a PLL circuit. More particularly, the present invention relates to a semiconductor device, a charge pump circuit and a PLL circuit that can suppress a switching noise.

2. Description of the Related Art

Figure 1:
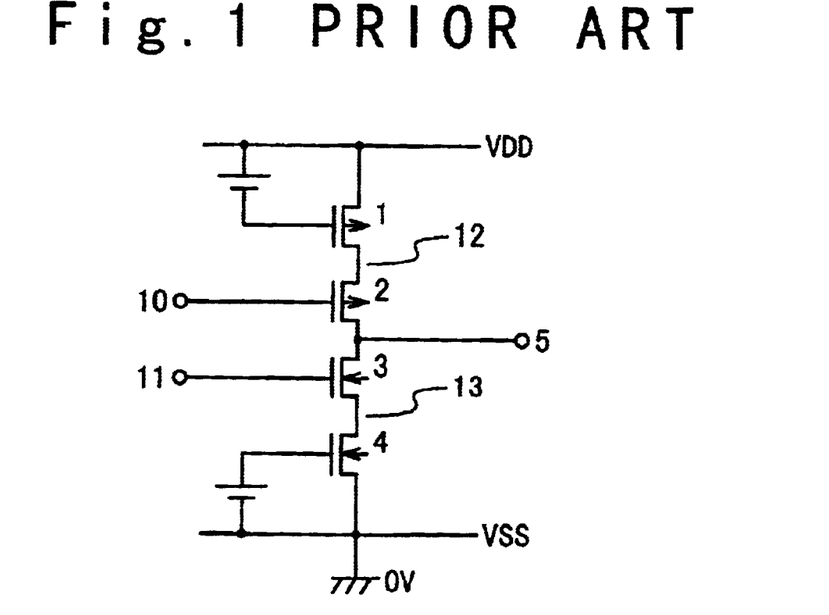
FIG. 1 is a circuit diagram of a conventional charge pump circuit.

As a conventional charge pump, a technique disclosed in Japanese Laid Open Patent Application (JP-A-Heisei, 11-339463) is well known. As shown in FIG. 1, when switching transistors 2, 3 connected to an up signal input terminal 10 and a down signal input terminal 11, respectively, are turned on and off, the parasitic capacitances of the respective transistors 2, 3 cause the voltages of drain terminals 12, 13 of constant current transistors 1, 4 to be different from each other.

For this reason, the current values are different when on-signals are inputted to the up signal input terminal 10 and the down signal input terminal 11, respectively. This difference brings about a generation of an error signal.

Figure 2:
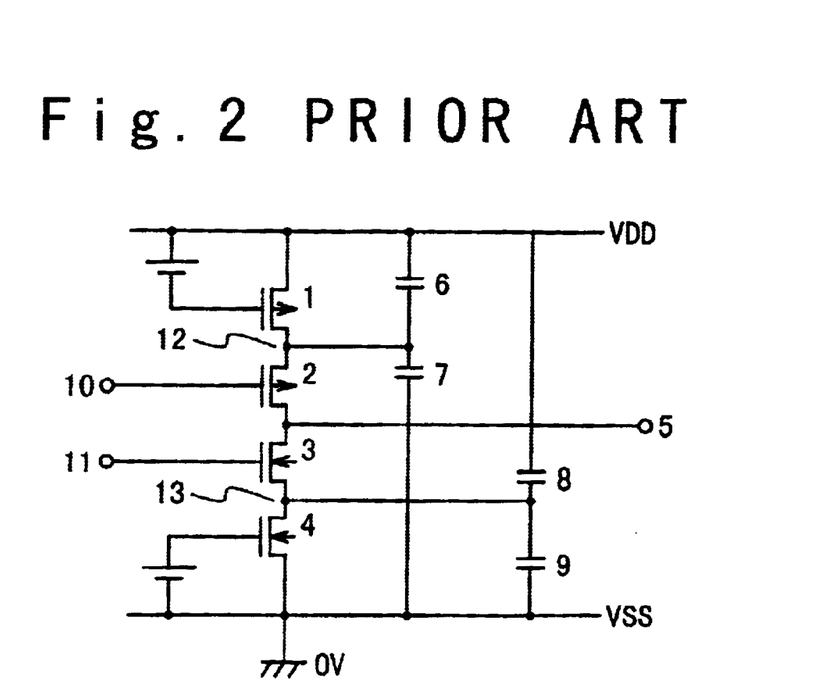
FIG. 2 is a circuit diagram showing another conventional charge pump circuit.

In order to solve the above-mentioned problem, conventionally, as shown in FIG. 2, a first condenser 6 is mounted between the drain of the constant current transistor 1 and a positive power supply terminal VDD, a second condenser 7 is mounted between the drain of the constant current transistor 1 and a negative power supply terminal VSS, a third condenser 8 is mounted between the drain of the constant current transistor 4 and the positive power supply terminal VDD, and a fourth condenser 9 is mounted between the drain of the constant current transistor 4 and the negative power supply terminal VSS.

The first and second condensers 6, 7 are used to keep the drain voltage and the source voltage of the switching transistor 2 substantially equal to each other. The third and fourth condensers 8, 9 are used to keep the drain voltage and the source voltage of the switching transistor 3 substantially equal to each other. Here, the condenser capacitances of the first to fourth condensers 6 to 9 are designed to be much larger than the parasitic capacitances on the drain terminals 12, 13 oft e constant current transistors 1, 4.

Accordingly, it is possible to reduce the voltage variations in the drain terminals 12, 13 when the on-signals are inputted to the up signal input terminal 10 and the down signal input terminal 11, respectively, and thereby possible to suppress the error current.

According to the above-mentioned configuration, a relatively large capacitance, such as several pF to several tens of pF, requires a wide area.

Also, the measure for the parasitic capacitances of the switching transistors 2, 3 that cause the switching noise is not carried out, which results in a problem that the switching noise is not suppressed. In the above-mentioned configuration, a switching voltage is 0 to VDD, and this is a very high value. Thus, the high voltage charged in the parasitic capacitance leads to the switching noise.

Further, Japanese Laid Open Patent Application (JP-A-2000-49596) discloses a charge pump circuit used in a PLL circuit. This charge pump circuit turns back a current generated from a constant current source by sing a current mirror circuit, via an analog switch that is always turned on, and in response to an UP signal sent from a frequency/phase comparator, sends/stops a constant current, which is turned ON/OFF by a switching circuit containing an analog switch and copied by a current mirror, towards a loop filter at a latter stage, and similarly in response to a DOWN signal, sends/stop a constant current, which is turned ON/OFF by a switching circuit containing an analog switch and copied by a current mirror, towards a loop filter at a latter stage.

A charge pump is desired for suppressing a switching noise, in particular, for suppressing a switching noise without the necessity for a wide area.

A charge pump is desired for suppressing a switching noise without any necessity of a wide area.

SUMMARY OF THE INVENTION

The present invention is accomplished in view of the above mentioned problems. Therefore, an object of the present invention is to provide a semiconductor device, a charge pump and a PLL circuit which can suppress a switching noise.

Another object of the present invention is to provide a semiconductor device, a charge pump and a PLL circuit which can suppress a switching noise without the necessity for a wide area.

Still another object of the present invention is to provide a semiconductor device, a charge pump and a PLL circuit which can suppress a switching noise and compensate for an error current.

Still another object of the present invention is to provide a semiconductor device, a charge pump and a PLL circuit which can suppress a switching noise without the necessity for a wide area and compensate for an error current.

In order to achieve an aspect of the present invention, a semiconductor device, includes: first and second output stage transistors generating an output signal as a result of a push-pull operation, which are mutually connected in series between a first power supply and a second power supply; a first transistor that has a control electrode, to which a first input signal is inputted, and is connected between the first power supply and the second power supply; a first constant current source connected in series to the first transistor between the first power supply and the second power supply; a first specific transistor which is connected in series to the first transistor and the first constant current source between the first power supply and the second power supply and connected as current mirror to the first output stage transistor; a second transistor that has a control electrode, to which a second input signal is inputted, and is connected between the first power supply and the second power supply; a second constant current source that is connected in series to the second transistor between the first power supply and the second power supply; and a second specific transistor which is connected in series to the second transistor and the second constant current source between the first power supply and the second power supply and connected as current mirror to the second output stage transistor.

In this case, the semiconductor device further includes: a current error compensation circuit compensating for errors of currents respectively flowing through the first and second output stage transistors at the time of the push-pull operation, in accordance with the output signal and a reference signal.

Also in this case, the first transistor and the second transistor are MOS-type transistors.

In order to achieve another aspect of the present invention, a charge pump circuit that is used in a PLL (Phase-Locked Loop) circuit, and generates an output signal in response to an up instruction signal and a down instruction signal sent from a phase comparator to drive a VCO (Voltage-Controlled Oscillator) in accordance with the output signal, includes: first and second output stage transistors generating the output signal as a result of a push-pull operation, which are mutually connected in series between a first power supply and a second power supply; a first transistor that has a control electrode, to which the up instruction signal is inputted, and is connected between the first power supply and the second power supply; a first constant current source that is connected in series to the first transistor between the first power supply and the second power supply; a first specific transistor which is connected in series to the first transistor and the first constant current source between the first power supply and the second power supply and connected as current mirror to the first output stage transistor; a second transistor that has a control electrode, to which an inversion signal of the down instruction signal is inputted, and is connected between the first power supply and the second power supply; a second constant current source that is connected in series to the second transistor between the first power supply and the second power supply; and a second specific transistor which is connected in series to the second transistor and the second constant current source between the first power supply and the second power supply and connected as current mirror to the second output stage transistor.

In this case, the charge pump circuit further includes: a current error compensation circuit compensating for errors of currents respectively flowing through the first and second output stage transistors at the time of the push-pull operation, in accordance with the output signal and a reference signal.

Also in this case, the first transistor and the second transistor are MOS-type transistors.

In order to achieve still another aspect of the present invention, a PLL (Phase-Locked Loop) circuit includes: a phase comparator; a VCO (Voltage Controlled Oscillator); and a charge pump circuit generating an output signal in response to an up instruction signal and a down instruction signal sent from the phase comparator to drive the VCO based on the output signal, and wherein the charge pump circuit includes: first and second output stage transistors generating the output signal as a result of a push-pull operation, which are mutually connected in series between a first power supply and a second power supply; a first transistor that has a control electrode, to which the up instruction signal is inputted, and is connected between the first power supply and the second power supply; a first constant current source that is connected in series to the first transistor between the first power supply and the second power supply; a first specific transistor which is connected in series to the first transistor and the first constant current source between the first power supply and the second power supply and connected as current mirror to the first output stage transistor; a second transistor that has a control electrode, to which an inversion signal of the do n instruction signal is inputted, and is connected between the first power supply and the second power supply; a second constant current source that is connected in series to the second transistor between the first power supply and the second power supply; and a second specific transistor which is connected in series to the second transistor and the second constant current source between the first power supply and the second power supply and connected as current mirror to the second output stage transistor.

In this case, the PL circuit further includes: a current error compensation circuit compensating for errors of currents respectively flowing through the first and second output stage transistors at the time of the push-pull operation, in accordance with the output signal and a reference signal.

Also in this case, the first transistor and the second transistor are MOS-type transistors.

In order to achieve et still another aspect of the present invention, a semiconductor device includes: first and second output stage transistors generating a first output signal as a result of a push-pull operation, which are mutually connected in series between a first power supply and a second power supply; third and fourth output stage transistors generating a second output signal as a result of a push-pull operation, which are mutually connected in series between the first power supply and the second power supply; first and second differential transistor pairs that conductive types are opposite to each other and have control electrodes connected to first and second input terminals, respectively; first and second constant current sources connected to the first and second differential transistor pairs, respectively; a first current mirror circuit connected between the first differential transistor pairs and the first power supply; a second current mirror circuit connected between the second differential transistor pairs and the second power supply; third and fourth differential transistor pairs that conductive types are opposite to each other and have control electrodes connected to third and fourth input terminals, respectively; third and fourth constant current sources connected to the third and fourth differential transistor pairs, respectively; a third current mirror circuit connected between the third differential transistor pairs and the first power supply; and a fourth current mirror circuit connected between the fourth differential transistor pairs and the second power supply, and wherein the first output stag transistor is included in the first current mirror circuit, and wherein the second output stage transistor is included in the fourth current mirror circuit, and wherein the third output stage transistor is included in the third current mirror circuit and wherein the fourth output stage transistor is included in the second current mirror circuit.

In this case, the semiconductor device further includes: a current error compensation circuit compensating for errors of currents respectively flowing through the first and second output stage transistors at the time of the push-pull operation, in accordance with the output signal and a reference signal.

In order to achieve another aspect of the present invention, a charge pump circuit that is used in a PLL (Phase-Locked Loop) circuit, and generates a first output signal and a second output signal in which the first output signal is inverted, in response to an up instruction signal and a down instruction signal sent from a phase comparator to drive a VCO (Voltage-Controlled Oscillator) in accordance with the first and second output signals, includes: first and second output stage transistors generating the first output signal as a result of a push-pull operation, which are mutually connected in series between a first power supply and a second power supply; third and fourth output stage transistors generating the second output signal as a result of a push-pull operation, which are mutually connected in series between the first power supply and the second power supply; first and second differential transistor pairs that conductive types are opposite to each other and have control electrodes connected to first and second input terminals, respectively, to which the up instruction signal and an up instruction inversion signal where the up instruction signal is inverted are sent; first and second constant current sources connected to the first and second differential transistor pairs, respectively; a first current mirror circuit connected between the first differential transistor pairs and the first power supply; a second current mirror circuit connected between the second differential transistor pairs and the second power supply; third and fourth differential transistor pairs that conductive types are opposite to each other and have a control electrode connected to third and fourth input terminals, respectively, to which the down instruction signal and a down instruction inversion signal where the down instruction signal is inverted are sent; third and fourth constant current sources connected to the third and fourth differential transistor pairs, respectively; a third current mirror circuit connected between the third differential transistor pairs and the first power supply; and a fourth current mirror circuit connected between the fourth differential transistor pairs and the second power supply, and wherein the first output stage transistor is included in the first current mirror circuit, and wherein the second output stage transistor is included in the fourth current mirror circuit, and wherein the third output stage transistor is included in the third current mirror circuit and wherein the fourth output stage transistor is included in the second current mirror circuit.

In this case, the charge pump circuit further includes: a current error compensation circuit compensating for errors of currents flowing through the first to fourth mirror circuits, respectively.

Also in this case, the charge pump circuit, further includes: fifth and sixth constant current sources connected in parallel to the first and third constant current sources, respectively; and wherein the current error compensation circuit generates a control signal corresponding to a difference between a set signal and a signal indicative of an average value between the first and second output signals, and wherein the fifth and sixth constant current sources change values of currents to be sent to the first and third differential transistor pairs, in response to the control signal.

In order to achieve till another aspect of the present invention, a PLL (Phase-Locked Loop) circuit includes: a phase comparator; a VCO (Voltage-Controlled Oscillator); and a charge pump circuit generating a first output signal and a second output signal in which the first output signal is inverted, in response to an up instruction signal and a down instruction signal sent from the phase comparator to drive the VCO in accordance with the first and second output signals, and wherein the charge pump circuit includes: first and second output stage transistors generating the first output signal as a result of a push-pull operation, which are mutually connected in series between first power supply and a second power supply; third and fourth output stage transistors generating the second output signal as a result of a push-pull operation, which are mutually connected in series between the first power supply and the second power supply; first and second differential transistor pairs that conductive types are opposite to each other and have control electrodes connected to first and second input terminals, respectively, to which the up instruction signal and an up instruction inversion signal where the up instruction signal is inverted are sent; first and second constant current sources connected to the first and second differential transistor pairs, respectively; a first current mirror circuit connected between the first differential transistor pairs and the first power supply; a second current mirror circuit connected between the second differential transistor pairs and the second power supply; third and fourth differential transistor airs that conductive types are opposite to each other and have control electrodes connected to third and fourth input terminals, respectively, to which the down instruction signal and a down instruction inversion signal where the down instruction signal is inverted are sent; third and fourth constant current sources connected to the third and fourth differential transistor pairs, respectively; a third current mirror circuit connected between the third differential transistor pairs and the first power supply; and a fourth current mirror circuit connected between the fourth differential transistor pairs and the second power supply, and wherein the first output stag transistor is included in the first current mirror circuit, and wherein the second output stage transistor is included in the fourth current mirror circuit, and wherein the third output stage transistor is included in the third current mirror circuit and wherein the fourth output stage transistor is included in the second current mirror circuit.

In order to achieve et still another aspect of the present invention, the PLL circuit further includes: a current e or compensation circuit compensating for errors of currents flowing through the first to fourth mirror circuits, respectively.

In the present invention, the charge pump circuit is constituted by using the current mirror in order to suppress the switching noise. Moreover, the error current compensation circuit is used in order to compensate for the error current in the charged case.

The UP, UPB, DOWN and DOWNB signals are inputted from the phase comparator to the differential circuits. The load of the differential circuit is constituted by the current mirror circuit. So, the current flowing through the load is outputted to the filter of the PLL.

Also, the differential circuit has the current error compensation terminal for compensating for the current errors on the UP side and the DOWN side. The operation for compensating for the current error compares a middle value of the capacitance terminal voltages of the respective filters with a reference voltage (ref), and its compared result is fed back to the charge pump (Common Mode Feed Back).

DESCRIPTION OF THE PREFERRED EMBODIMENTS

Embodiments of the present invention will be described below in detail with reference to the attached drawings.

A charge pump circuit in this embodiment is a charge pump circuit composed of MOS-type transistors for driving a variable frequency oscillator via a loop filter, in response to a down instruction (DOWN) signal and an up instruction (UP) signal sent from a frequency phase comparator of a PLL (Phase-Locked Loop) circuit locked at a phase of an input signal.

Figure 3:
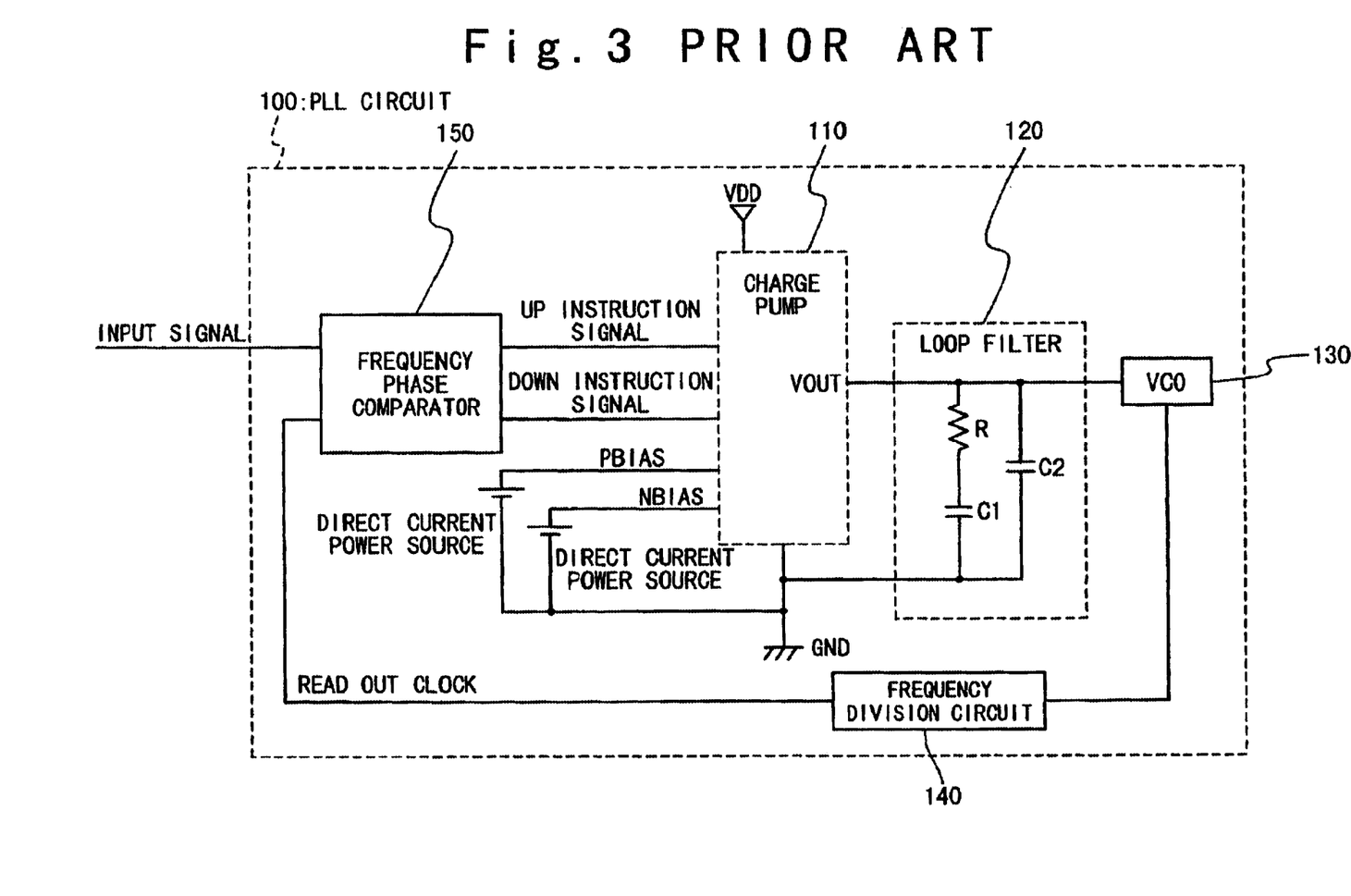
FIG. 3 is a circuit diagram showing a conventional typical PLL circuit.

At first, a typical conventional PPL circuit is described with reference to FIG. 3.

A PLL circuit 100 contains a first or second loop filter 120 having resistors and condensers, a VCO (Voltage Controlled Oscillator) 130, a division circuit 140, a frequency phase detection circuit 150, a charge pump 110 and the like.

The loop filter 120 functions as a low pass filter and generates a terminal voltage of a condenser C2 as a control voltage.

The division circuit 140 divides an oscillation signal of the VCO 130 on the basis of a division ratio, and generates the divided signal as an output signal.

The frequency phase detection circuit 150 detects the errors in frequencies and phases between an input signal and a signal in which the oscillation signal of the VCO 130 is divided by the division circuit 140, and generates an up instruction (UP) signal and a down instruction (DOWN) signal, on the basis of the errors.

The charge pump 110 implants a certain current from a power supply VDD into the loop filter 120, in response to the up instruction (UP) signal, and accumulates charges in condensers C1, C2. Also, the charge pump 110 discharges the certain current from the loop filter 120, in response to the down instruction (DOWN) signal, and discharges the charges accumulated in the condensers C1, C2, and implants into the charge pump 110.

The above-mentioned series of operations enables the components of the phases and the frequencies in the input signal and the output signal to be coincident with each other, in the PLL circuit 100 (Synchronous State).

A charge pump circuit in this embodiment will be described below with reference to FIGS. 4 and 5. The charge pump circuit in this embodiment is applied to a PLL circuit for a high speed communication.

Figure 4:
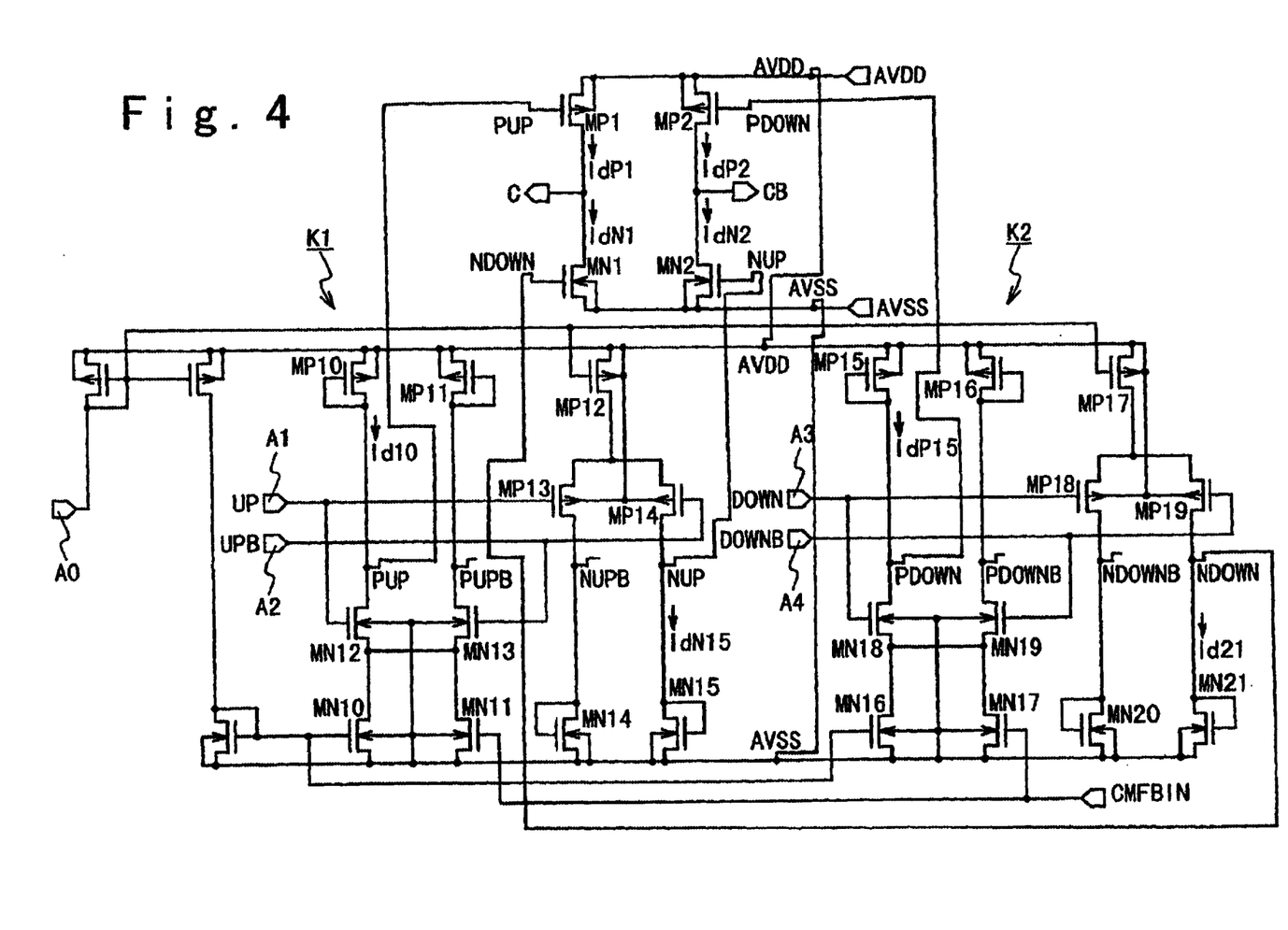
FIG. 4 is a circuit diagram showing a charge pump circuit of a first embodiment of the present invention.

As shown in FIG. 4, the charge pump circuit is provided with an up stage K1 and a down stage K2.

Figure 5:
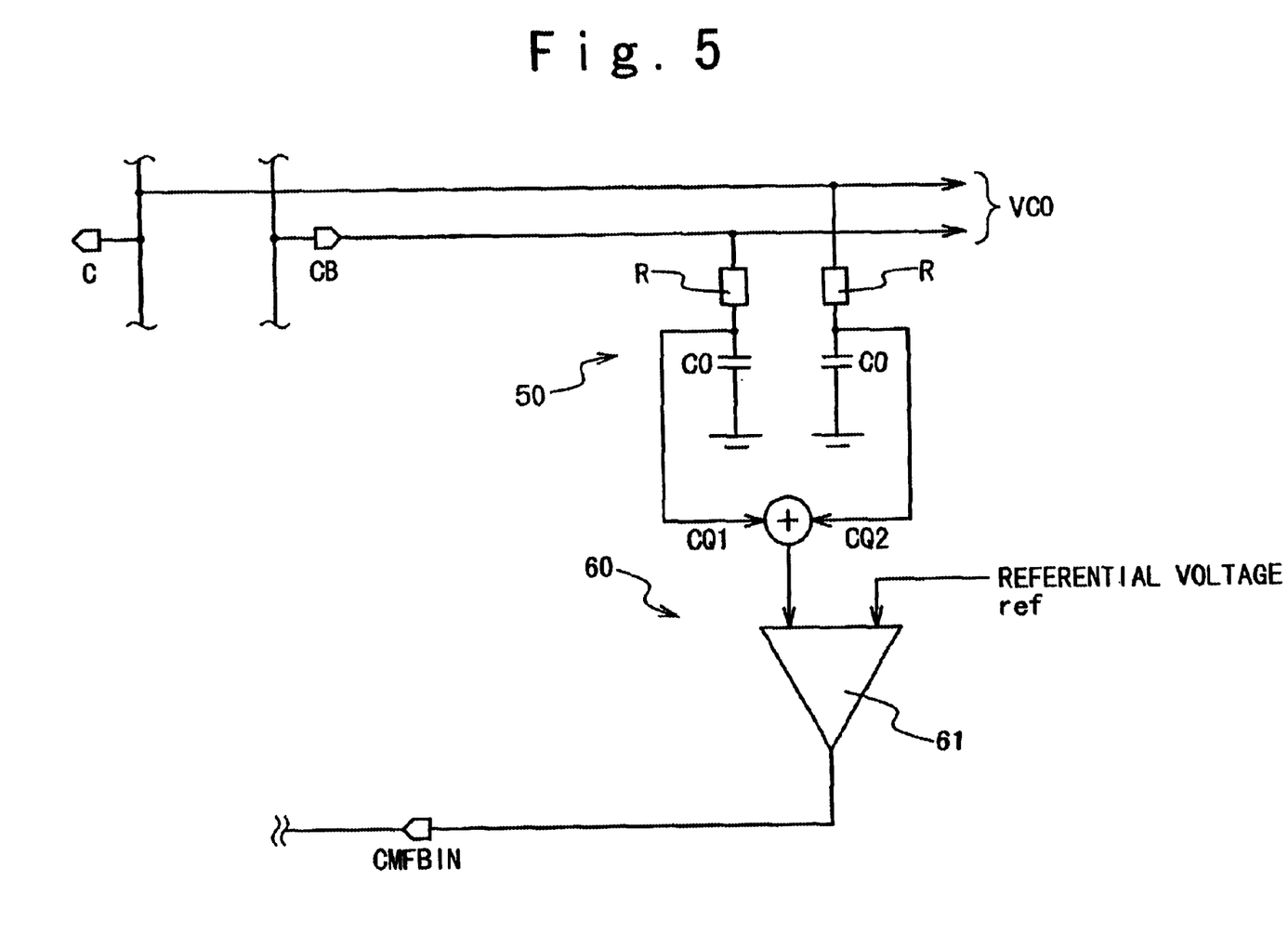
FIG. 5 is a circuit diagram showing a current error compensation circuit connected to the charge pump circuit of the first embodiment of the present invention.

As shown in FIG. 5, output signals outputted from an output terminal C and an output terminal (an inversion terminal of the output terminal C) CB of the charge pump circuit are outputted through a PLL filter 50 to the VCO, wherein the PLL filter 50 is a low pass filter composed of a resistor R and a condenser CO.

At first, the up stage K1 of the charge pump circuit is described with reference to FIG. 4.

In the up stage K1, differential amplifier composed of N-channel transistors MN12, MN13 is connected in parallel to a differential amplifier composed of P-channel transistors MP13, MP14.

The N-channel transistors MN12, MN13 constitute the differential amplifier. Sources of the N-channel transistors MN12, MN13 are connected to each other. A gate of the N-channel transistor MN12 is connected to an input terminal (UP) A1. The up instruction (UP) signal is inputted to the input terminal A1. A gate of the N-channel transistor MN13 is connected to an input terminal (UPB) A2. An inversion signal of the up instruction (UP) signal is inputted to the input terminal A2.

In an N-channel transistor MN10 for a constant current source, its source is connected to a low potential side power supply AVSS, and its drain is connected to the commonly connected sources of the N-channel transistors MN12, MN13. The N-channel transistor MN10 for the constant current source is a current suck type, and a current of 10 $\mu$A flows through it.

P-channel transistors MP10, MP1 constitute a current mirror circuit functioning as the positive load of the differential amplifiers MN12, MN13. In each of the P-channel transistors MP10, MP1, its source is connected to a high potential side power supply AVDD. A gate of the P-channel transistor MP1 is connected to the drain of the N-channel transistor MN12, and its drain is connected to an output terminal C. A drain of the P-channel transistor MP10 is connected to the drain of the N-channel transistor MN12. The gate and the drain of the P-channel transistor MP10 are connected to each other.

In the P-channel transistor MP11, its drain is connected to the drain of the N-channel transistor MN13, and its source is connected to the high potential side power supply AVDD. In the P-channel transistor MP11, properties equal to those of the P-channel transistor MP10 are used in order to make the loads of the differential amplifiers MN12, MN13 equal to each other.

In the N-channel transistor MN11 for the constant current source, its drain is connected to the sources of the N-channel transistors MN13, MN12, and its source is connected to the low potential side power supply VSS. The N-channel transistor MN11 for the constant current source and an N-channel transistor MN26 of FIG. 6 constitute a current mirror circuit.

The P-channel transistors MP13, MP14 constitute the differential amplifier. The sources of the P-channel transistors MP13, MP14 are connected to each other. The gate of the P-channel transistor MP13 is connected to the input terminal A1. The gate of the P-channel transistor MP14 is connected to the input terminal A2.

In the P-channel transistor MP12 for the constant current source, its source is connected to the high potential side power supply AVDD, and its drain is connected to the commonly connected sources of the P-channel transistors MP13, MP14. A current of 10 $\mu$A flows through the P-channel transistor MP12 for the constant current source.

N-channel transistors MN15, MN2 constitute a current mirror circuit functioning as the positive load of the differential amplifiers MP13, MP14. In each of the N-channel transistors MN15, MN2, its source is connected to the low potential side power supply AVSS. A gate of the N-channel transistor MN2 is connected to the drain of the P-channel transistor MP14, and its drain is connected to an output terminal CB. A drain of the N-channel transistor MN15 is connected to the drain of the P-channel transistor MP14. The gate and the drain of the N-channel transistor MN15 are connected to each other.

In the N-channel transistor MN14, its drain is connected to the drain of the P-channel transistor MP13, and its source is connected to the low potential side power supply AVSS. In the N-channel transistor MN14, the property equal to that of the N-channel transistor MN15 is used in order to make the loads of the differential amplifiers MP13, MP14 equal to each other.

The down stage K2 of the charge pump circuit will be described below.

In the down stage K2, a differential amplifier composed of N-channel transistors MN18, MN19 is connected in parallel to a differential amplifier composed of P-channel transistors MP18, MP19.

The N-channel transistors MN18, MN19 constitute the differential amplifier. Sources of the N-channel transistors MN18, MN19 are connected to each other. A gate of the N-channel transistor MN18 is connected to an input terminal (DOWN) A3. The down instruction (DOWN) signal is inputted to the input terminal A3. A gate of the N-channel transistor MN19 is connected to an input terminal (DOWNB) A4. An inversion signal of the down instruction (DOWN) signal is inputted to the input terminal A4.

In an N-channel transistor MN16 for a constant current source, its source is connected to a low potential side power supply AVSS, and its drain is connected to the commonly connected sources of the N-channel transistors MN18, MN19. The N-channel transistor MN16 for the constant current source is the current suck type, and a current of 10 μA flows through it.

P-channel transistors MP15, MP2 constitute a current mirror circuit functioning as the positive load of the differential amplifiers MN18, MN19. In each of the P-channel transistors MP15, MP2, its source is connected to a high potential side power supply AVDD. A gate of the P-channel transistor MP2 is connected to the drain of the N-channel transistor MN18, and its drain is connected to an output terminal CB. A drain of the P-channel transistor MP15 is connected to the drain of the N-channel transistor MN18. The gate and the drain of the P-channel transistor MP15 are connected to each other.

In the P-channel transistor MP16, its source is connected to the high potential side power supply AVDD, and its drain is connected to the drain of the N-channel transistor MN19. In the P-channel transistor MP16, the property equal to that of the P-channel transistor MP15 is used in order to make the loads of the differential amplifiers MN18, MN19 equal to each other.

In the N-channel transistor MN17 for the constant current source, its source is connected to the low potential side power supply AVSS, and its drain is connected to the sources of the N-channel transistors MN18, MN19. The N-channel transistor MN17 for the constant current source and the N-channel transistor MN26 of FIG. 6 constitute a current mirror circuit.

The P-channel transistors MP18, MP19 constitute the differential amplifier. The sources of the P-channel transistors MP18, MP19 are connected to each other. The gate of the P-channel transistor MP18 is connected to the input terminal A3. The gate of the P-channel transistor MP19 is connected to the input terminal A4.

In the P-channel transistor MP17 for the constant current source, its source is connected to the high potential side power supply AVDD, and its drain is connected to the commonly connected sources of the P-channel transistors MP18, MP19. A current of 10 μA flows through the P-channel transistor MP17 for the constant current source.

N-channel transistors MN21, MN1 constitute a current mirror circuit functioning as the positive load of the differential amplifiers MP18, MP19. In each of the N-channel transistors MN21, MN1, its source is connected to the low potential side power supply AVSS. A gate of the N-channel transistor MN1 is connected to the drain of the P-channel transistor MP19, and its drain is connected to an output terminal C. A drain of the N-channel transistor MN21 is connected to the drain of the P-channel transistor MP19. The gate and the drain of the N-channel transistor MN21 are connected to each other.

In the N-channel transistor MN20, its source is connected to the low potential side power supply AVSS, and its rain is connected to the drain of the P-channel transistor MP18. In the N-channel transistor MN20, properties equal to those of the N-channel transistor MN21 are used in order to make the loads of the differential amplifiers MP18, MP19 equal to each other.

Further, the current flows from an input terminal AO to the charge pump circuit. The circuit (group) between the input terminal A0, the N-channel transistor MN10 for the constant current source, the P-channel transistor MP12 for the constant current source, the N-channel transistor MN16 for the constant current source and the P-channel transistor MP17 for the constant current source enables the values of the currents (the values of the constant currents) flowing through the transistors MN10, MP12, MN16 and MP17 for the respective constant current sources to be set at 10 μA.

The operations of the present invention will be described below.

The current mirror circuits MP10, MP1 are connected instead of the load resistors of the differential amplifiers MN12, MN13. The action of the current mirror makes a drain current IdP1 of the transistor MP1 equal to the drain current Id10 of the transistor MP10.

The current mirror circuits MN15, MN2 are connected instead of the load resistors of the differential amplifiers MP13, MP14. The action of the current mirror makes a drain current IdN2 of the transistor MN2 equal to the drain current IdN15 of the transistor MN15.

The current mirror circuits MP15, MP2 are connected instead of the load resistors of the differential amplifiers MN18, MN19. The action of the current mirror makes a drain current IdP2 of the transistor MP2 equal to the drain current IdP15 of the transistor MP15.

The current mirror circuits MN21, MN1 are connected instead of the load resistors of the differential amplifiers MP18, MP19. The action of the current mirror makes a drain current IdN1 of the transistor MN1 equal to the drain current Id21 of the transistor MN21.

A first case, in which a voltage higher than that of the input terminal (UPB) A2 is applied to the input terminal (UP) A1, will now be described. At this time, a voltage lower than that of the input terminal (DOWNB) is applied to the input terminal (DOWN) A3.

When a signal of a high voltage is inputted to the input terminal (UP) A1, a gate voltage of the N-channel transistor MN12 is made higher. Thus, the currents of 10 μA flow from the high potential side power supply AVDD into the P-channel transistor MP10, the N-channel transistor MN12 and the N-channel transistor MN10 for the constant current source. At this time, the action of the current mirror causes the drain current IdP1 of the P-channel transistor MP1 to be 10 μA equal to the drain current Id10 of the P-channel transistor MP10.

When a signal of a high voltage is inputted to the input terminal (UP) A1, a signal of a low voltage that is its inversion signal is inputted to the input terminal (UPB) A2. Thus, a gate voltage of the N-channel transistor MN13 is made lower. Hence, the currents do not substantially flow from the high potential side power supply AVDD into the P-channel transistor MP11 and the N-channel transistor MN13.

When a signal of a high voltage is inputted to the input terminal (UP) A1, a gate voltage of the P-channel transistor MP13 is made higher. Thus, the currents do not substantially flow into the P-channel transistor MP13 and the N-channel transistor MN14.

When a signal of a high voltage is inputted to the input terminal (UP) A1, the signal of the low voltage that is its inversion signal is inputted to the input terminal (UPB) A2. Thus, a gate voltage of the P-channel transistor MP14 is made lower. Hence, the currents of 10 μA flow from the high potential side power supply AVDD into the P-channel transistor MP12 for the constant current source, the P-channel transistor MP14 and the N-channel transistor MN15. At this time, the current mirror causes a drain current IdN2 of the N-channel transistor MN12 to be 10 μA, equal to the drain current IdN15 of the N-channel transistor MN15.

When a signal of a low voltage is inputted to the input terminal (DOWN) A3, a gate voltage of the N-channel transistor MN18 is made lower. Thus, the currents do not substantially flow from the high potential side power supply AVDD into the P-channel transistor MPl5, the N-channel transistor MN18 and the N-channel transistor MN16 for the constant current source. At this time, the current mirror causes a drain current IdP2 of the P-channel transistor MP2 to be substantially 0 μA, equal to the drain current IdP15 of the P-channel transistor MP15.

When a signal of a low voltage is inputted to the input terminal (DOWN) A3, a signal of a high voltage that is its inversion signal is inputted to the input terminal (DOWNB) A4. Thus, a gate voltage of the N-channel transistor MN19 is made higher. Hence, the currents of 10 μA flow from the high potential side power supply AVDD into the P-channel transistor MP16, the N-channel transistor MN19 and the N-channel transistor MN16 for the constant current source.

When a signal of a low voltage is inputted to the input terminal (DOWN) A3, a gate voltage of the P-channel transistor MP18 is made lower. Thus, the currents of 10 μA flow from the high potential side power supply AVDD into the P-channel transistor MP17 for the constant current source, the P-channel transistor MP18 and the N-channel transistor MN20.

When a signal of a low voltage is inputted to the input terminal (DOWN) A3, a signal of a high voltage that is its inversion signal is inputted to the input terminal (DOWNB) A4. Thus, a gate voltage of the P-channel transistor MP19 is made higher. Hence, the currents do not substantially flow into the P-channel transistor MP19 and the N-channel transistor MN21. At this time, the current mirror causes a drain current IdN1 of the N-channel transistor MN1 to be substantially 0 μA, equal to the drain current Id21 of the N-channel transistor MN21.

From the above-mentioned explanations, the following operations are carried out when a voltage higher than that of he input terminal (UPB) A2 is applied to the input terminal (UP) A1 and a voltage lower than that of the input terminal (DOWNB) A4 is applied to the input terminal(DOWN)A3.

The drain current IdP1 of the P-channel transistor MP1 of 10 μA flows into the output terminal C from the high potential side power supply AVDD. At this time, the current flowing into the low potential side power supply AVSS from the output terminal C through the N-channel transistor MN1 is at the cut state (the drain current IdN1 is very small). Thus, the current flowing into the P-channel transistor MP1 from the high potential side power supply AVDD flows into the output terminal C. Hence, the potential of the output terminal C is increased.

Also, the drain current IdN2 of the N-channel transistor MN2 of 10 μA flows into the low potential side power supply AVSS from the output terminal CB through the N-channel transistor MN2. At this time, the current flowing into the output terminal CB from the high potential side power supply AVDD through the P-channel transistor MP2 is cut off (the drain current IdP2 is very small). Thus, the fact that the current of 10 μA flows into the low potential side power supply AVSS from the output terminal CB through the N-channel transistor MN2 causes the potential of the output terminal CB to be decreased.

Next, a case in which the voltage lower than that of the input terminal (UPB) A2 is applied to the input terminal (UP) A1 will be described below. At this time, the voltage higher than that of the input terminal (DOWNB) A4 is applied to the input terminal (DOWN)A3.

When a signal of a low voltage is inputted to the input terminal (UP) A1, a gate voltage of the N-channel transistor MN12 is made lower. Thus, the currents do not substantially flow from the high potential side power supply AVDD into the P-channel transistor MP10, the N-channel transistor MN12 an the N-channel transistor MN10 for the constant current source. At this time, the current mirror causes a drain current IdP1 of the P-channel transistor MP1 to be substantially 0 μA, equal to the drain current Id10 of the P-channel transistor MP10.

When a signal of a low voltage is inputted to the input terminal (UP) A1, a signal of a high voltage that is its inversion signal is inputted to the input terminal (UPB) A2. Thus, a gate voltage of the N-channel transistor MN13 is made higher. Hence, the currents of 10 μA flow from the high potential side power supply AVDD into the P-channel transistor MP11, the N-channel transistor MN13 and the N-channel transistor MN10 for the constant current source.

When a signal of a low voltage is inputted to the input terminal (UP) A1, a gate voltage of the P-channel transistor MN13 is made lower. Thus, the current of 10 μA flows from the high potential side power supply AVDD into the P-channel transistor MP12 for the constant current source, the P-channel transistor MP13 and the N-channel transistor MN14.

When a signal of a low voltage is inputted to the input terminal(UP)A1, a signal of a high voltage that is its inverson signal is inputted to the input terminal (UPB) A2. Thus, a gate voltage of the P-channel transistor MN14 is made higher. Hence, the currents do not substantially flow into the P-channel transistor MP14 and the N-channel transistor MN15. At this time, the current mirror causes a drain current IdN2 of the N-channel transistor MN2 to be substantially 0 μA, equal to t e drain current IdN15 of the N-channel transistor MN15.

When a signal of a high voltage is inputted to the input terminal(DOWN)A3, a gate voltage of the N-channel transistor MN18 is made higher. Thus, the currents of 10 μA flow from the high potential side power supply AVDD into the P-channel transistor MP15, the N-channel transistor MN18 and the N-channel transistor MN16 for the constant current source. At this time, the current mirror c uses a drain current IdP2 of the P-channel transistor MP2 to be 10 μA, equal to the drain current IdP15 of the P-channel transistor MP15.

When a signal of a high voltage is inputted to the input terminal (DOWN) A3, a signal of a low voltage that is its inversion signal is inputted to the input terminal (DOWNB) A4. Thus, a gate voltage of the N-channel transistor MN19 is made lower. Hence, the currents do not substantially flow from the high potential side power supply AVDD into the P-channel transistor MP16 and the N-channel transistor MN19.

When a signal of a high voltage is inputted to the input terminal (DOWN) A3, a gate voltage of the P20 channel transistor MP18 is made higher. Thus, the currents do not substantially flow into the P-channel transistor MP18 and the N-channel transistor MN20.

When a signal of a high voltage is inputted to the input terminal(DOWN)A3, a signal of a low voltage that is its inversion signal is inputted to the input terminal (DOWNB) A4. Thus, a gate voltage of the P-channel transistor MN19 is made lower. Hence, the currents of 10 μA flow from the high potential side power supply AVDD into the P-channel transistor MP17 for the constant current source, the P-channel transistor MP19 and the N-channel transistors MN21. At this time, the current mirror causes a drain current IdN1 of the N-channel transistor MN1 to be 10 μA, equal to the drain current Id21 of the N-channel transistor MN21.

From the above-mentioned explanations, the following operations are carried out when the voltage lower than that of the input terminal (UPB) A2 is applied to the input terminal (UP) A1 and the voltage higher than that of the input terminal (DOWNB) A4 is applied to the input terminal (DOWN) A3.

The drain current IdP2 of the P-channel transistor MP2 of 10 μA flows into the output terminal CB from the high potential side power supply AVDD. At this time, the current flowing into the low potential side power supply AVSS from the output terminal CB through the N-channel transistor MN2 is at the cut state (the drain current IdN2 is very small). Thus, the current flowing into the P-channel transistor MP2 from the high potential side power supply AVDD flows into the output terminal CB. Hence, the potential of the output terminal CB is increased.

Also, the drain current IdN1 of the N-channel transistor MN1 of 10 μA flows into the low potential side power supply AVSS from the output terminal C through the N-channel transistor MN1. At this time, the current flowing into the output terminal C from the high potential side power supply AVDD through the P-channel transistor MP1 is cut off (the drain current IdP1 is very small). Thus, the fact that the current of 10 μA flows into the low potential side power supply AVSS from the output terminal C through the N-channel transistor MN1 causes the potential of the output terminal C to be decreased.

Conventionally, the switching voltages when the UP signal and the DOWN signal are inputted from the phase comparator to the gate of the switching transistor are high, such as 0 to VDD. Thus, the high voltage charged in the parasitic condenser brings about the switching noise.

On the contrary, in this embodiment, the load of the differential amplifier is constituted by the current mirror circuit. Thus, the change in the switching voltage between 0 and VDD can be converted into the change of the small current (0 to 10 μA in this embodiment). Its small current is outputted to the PLL filter 50 from the output terminals C and CB. At this time, the changes in the gate potentials of the transistors (MP1, MP2, MN1 and MN2) constituting the current mirror circuit are 500 mV (in a case of a 3.3 power supply). Thus, the amplitude of the gate potential is equal to or less than ⅙ that of the conventional circuit. Hence, the switching noise can be also reduced to the degree similar to that of the conventional circuit.

Figure 6:
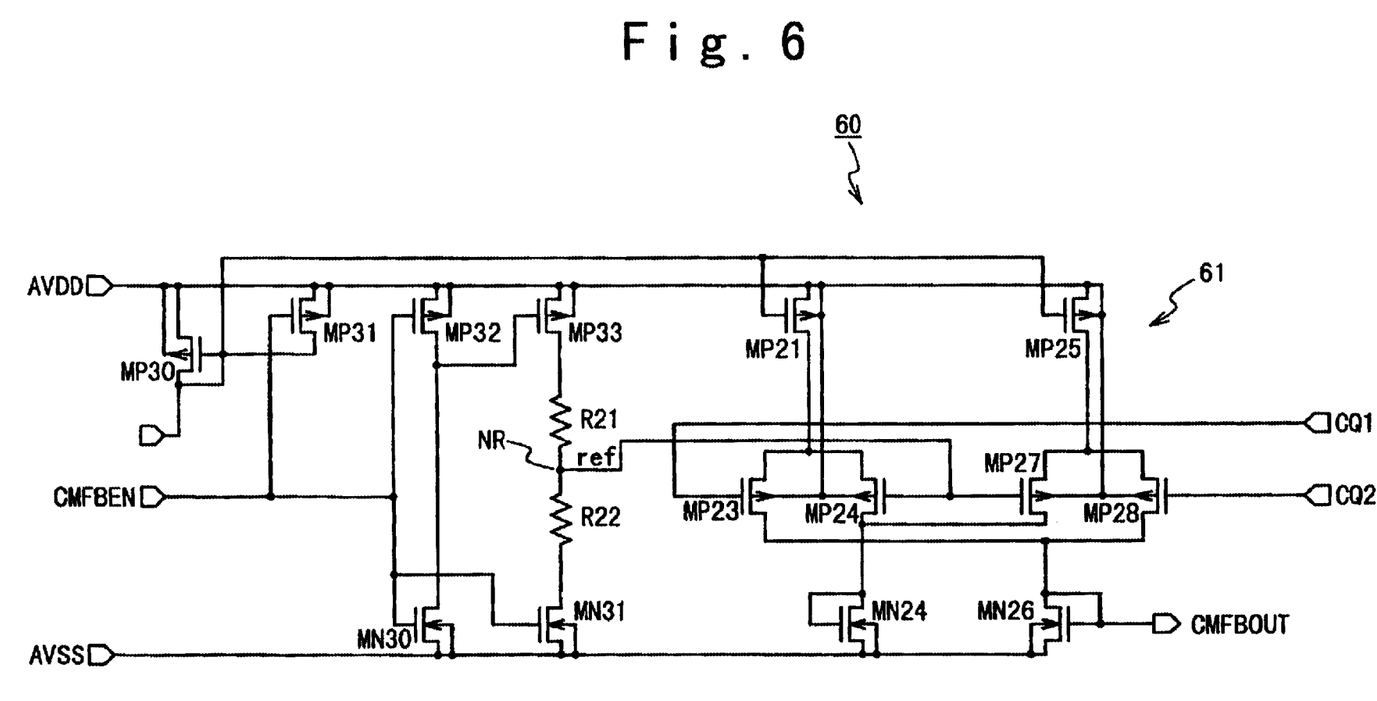
FIG. 6 is a circuit diagram showing in detail the current error compensation circuit of the first embodiment of the present invention.

A current error compensation circuit (Common Mode Feed Back Circuit) will be described below with reference to FIGS. 4 to 6.

The current error compensation circuit 60 is connected to the above-mentioned charge pump circuit (FIG. 4).

As mentioned above, the output stage for sending the output signal to the output terminal C is constituted by the push-pull transistors composed of the P-channel transistor MP1 and the N-channel transistor MN1. Similarly, the output stage for sending the output signal to the output terminal CB is constituted by the push-pull transistors composed of the P-channel transistor MP2 and the N-channel transistor MN2.

In both the push-pull transistors, because of the typical properties of the usual transistors, the forces at which the N-channel transistors MN1, MN2 decrease (pull) the potentials of the output terminals C, CB are greater than the forces at which the P-channel transistors MP1, MP2 increase (push) the potentials of the output terminals C, CB.

Because of this fact, there may be the case that the (average) potentials of the output signals C, CB outputted from both the push-pull transistors are gradually decreased to thereby stop the oscillation of the VCO.

So, in this embodiment, the current error compensation circuit 60 is mounted so as to keep the average values of the output terminals C, CB at the set values. As shown in FIG. 5, the average values of potentials of signals CQ1, CQ2 and a reference voltage ref are inputted to a differential amplifier 61. A signal based on a difference between those input signals is outputted to a current error compensation input terminal CMFBIN (refer to FIG. 4).

Here, the signal CQ1 has a voltage (capacitance terminal voltage) that results from a voltage drop through a resistor of the PLL filter 50 when the output signal C is inputted to the PLL filter 50.

Similarly, the signal CQ2 has a voltage (capacitance terminal voltage) that results from the voltage drop through the resistor of the PLL filter 50 when the output signal CB is inputted to the PLL filter 50.

The detailed circuit configuration of the current error compensation circuit 60 will be described below with reference to FIG. 6.

A signal outputted from an output terminal CMFBOUT of the current error compensation circuit 60 is inputted to the current error compensation input terminal CMFBIN in FIGS. 4, 5.

The differential amplifier 61 is constituted by P-channel transistors MP23, 24, 27 and 28. The signal CQ1 is inputted to a gate of the P-channel transistor MP23. The signal CQ2 is inputted to a gate of the P-channel transistor MP28. The reference voltage ref is applied to the respective gates of the P-channel transistors MP24, MP27.

A drain of the P-channel transistor MP21 for the constant current source is connected to respective sources of the P-channel transistors MP23, MP24. A source of the P-channel transistor MP21 for the constant current source is connected to the high potential side power supply AVDD.

A drain of the P-channel transistor MP25 for the constant current source is connected to respective sources of the P-channel transistors MP27, MP28. A source of the P-channel transistor MP25 for the constant current source is connected to the high potential side power supply AVDD.

In a node NR, the reference voltage ref is set since the voltage between the high potential side power supply AVDD and the low potential side power supply AVSS is divided by resistors R21, R22, respectively.

The operation of the current error compensation circuit 60 will be described below.

In the differential amplifier 61, each of the potentials of the signals CQ1, CQ2 is compared with the reference voltage ref, and a signal on the basis of the difference is outputted to the output terminal CMFBOUT.

A signal from the output terminal CMFBOUT is inputted to the current error compensation input terminal CMFBIN. Thus, the respective gate voltages of the N-channel transistor MN11 for the constant current source and the N-channel transistor MN17 for the constant current source are controlled. Hence, the value of the current, which flows through each of the N-channel transistor 11 for the constant current source and the N-channel transistor MN17 for the constant current source is increased or decreased.

Here, each of the N-channel transistor MN11 for the constant current source and the N-channel transistor MN17 for the constant current source and the N-channel transistor MN26 of the current error compensation circuit 60 constitute the current mirror circuit, as mentioned above.

The N-channel transistor MN11 for the constant current source and the N-channel transistor MN17 for the constant current source are connected in parallel to the N-channel transistor MN10 for the constant current source and the N-channel transistor MN16 for the constant current source, respectively. Thus, the values of the currents flowing through the differential transistors pair (MN12, MN13, MN18, MN19) are controlled by the signal inputted to the current error compensation input terminal CMFBIN.

As mentioned above, the current error compensation circuit 60 carries out the same phase signal feedback control (CMFB) so that the potentials of the signals CQ1, CQ2 are equal to the reference voltage ref. Thus, there is no fear that the oscillation of the VCO will stop.

By the way, the current error compensation circuit 60 is effective not only for the property compensation of the above-mentioned push-pull transistor but also for the temperature compensation.

According to this embodiment, the following effects can be obtained from the above-mentioned explanations.

The large reduction in the switching noise of the charge pump suppresses the jitter caused by the switching noise.

Since the current flowing into the charge pump is equal to the differential current, the residual current occurring in the conventional charge pump is never induced, which enables the suppression of the jitter caused by the residual current.

The amount at which the peak current caused by a parasitic capacitance induced when an MOS transistor is switched is sent to the charge pump is reduced, which results in the suppression of the switching noise.

It is possible to easily carry out the error current compensation of the charge pump that creates trouble in the case of the differential control of the VCO. Thus, this enables the differential control type PLL to be stably attained using only the capacitance within a chip.

According to the present invention, the switching noise is suppressed.

What is claimed is:

1. A semiconductor device, comprising:
   first and second output stage transistors generating an output signal as a result of a push-pull operation, said first an second output stage transistors being mutually connected in series between a first power supply and a second power supply,
   a first transistor that has a control electrode, to which a first input signal is inputted, and is connected between said first power supply and said second power supply;
   a first constant current source connected in series to said first transistor between said first power supply and said second power supply;
   a first specific transistor which is connected in series to said first transistor and said first constant current source between said first power supply and said second power supply and connected as current mirror to said first output stage transistor;
   a second transistor that has a control electrode, to which a second input signal is inputted, and is connected between said first power supply and said second power supply,
   a second constant current source that is connected in series to said second transistor between said first power supply and said second power supply; and
   a second specific transistor which is connected in series to said second transistor and said second constant current source between said first power supply and said second power supply and connected as current mirror to said second output stage transistor; and
   further comprising:
   a current error compensation circuit compensating for errors of currents respectively flowing through said first and second output stage transistors at the time of said push-pull operation, in accordance with said output signal and a reference signal.

2. A charge pump circuit that is used in a PLL (Phase-Locked Loop) circuit, and generates an output signal in response to an up instruction signal and a down instruction signal sent from a phase comparator to drive a VCO (Voltage-Controlled Oscillator) in accordance with said output signal, comprising:
   first and second output stage transistors generating said output signal as a result of a push-pull operation, said first and second output stage transistors being mutually connected in series between a first power supply and a second power supply;
   a first transistor that has a control electrode, to which said up instruction signal is inputted, and is connected between said first power supply and said second power supply;
   a first constant current source that is connected in series to said first transistor between said first power supply said second power supply;
   a first specific transistor which is connected in series to said first transistor and said first constant current source between said first power supply and said second power supply and connected as current mirror to said first output stage transistor;
   a second transistor at has a control electrode, to which an inversion signal of said down instruction signal is inputted, and is connected between said first power supply and said second power supply;
   a second constant current source that is connected in series to said second transistor between said first power supply and said second power supply; and
   a second specific transistor which is connected in series to said second transistor and said second constant current source between said first power supply and said second power supply and connected as current mirror to said second output stage transistor; and
   further comprising:
   a current error compensation circuit compensating for errors of currents respectively flowing through said first and second output stage transistors at the time of said push-pull operation, in accordance with said output signal and a reference signal.

3. A PLL (Phase-Locked Loop) circuit, comprising:
   a phase comparator;
   a VCO (Voltage Controlled Oscillator); and
   a charge pump circuit generating on output signal in response to an up instruction signal and a down instruction sign sent from said phase comparator to drive said VCO based on said output signal, and wherein said charge pump circuit includes:
first and second output stage transistors generating said output signal as a result of a push-pull operation, said first and second output stage transistors being mutually connected in series between a first power supply and a second power supply;
a first transistor that as a control electrode, to which said up instruction signal is inputted, and is connected between said first power supply and said second power supply;
a first constant current source that is connected in series to said first transistor between said first power supply and said second power supply;
a first specific transistor which is connected in series to said first transistor and said first constant current source between said first power supply and said second power supply and connected as current mirror to said first output stage transistor;
a second transistor that has a control electrode, to which an inversion signal of said down instruction signal is inputted, and is connected between said first power supply and said second power supply;
a second constant current source that is connected in series to said second transistor between said first power supply and said second power supply; and
a second specific transistor which is connected in series to said second transistor and said second constant current source between said first power supply and said second power supply and connected as current mirror to said second output stage transistor; and
further comprising:
a current error compensation circuit compensating for errors of currents respectively flowing through said first and second output stage transistors at the time of said push-pull operation, in accordance with said output signal and a reference signal.

4. A semiconductor device, comprising:
first and second output stage transistors generating a first output signal as a result of a push-pull operation, said first and second output stage transistors being mutually connected in series between a first power supply and a second power supply;
third and fourth output stage transistors generating a second output signal as a result of a push-pull operation, said third and fourth output stage transistors being mutually connected in series between said first power supply and said second power supply;
first and second differential transistor pairs having conductive types opposite to each other and having control electrodes connected to first and second input terminals, respectively;
first and second constant current sources connected to said first and second differential transistor pairs, respectively;
a first current mirror circuit connected between said first differential transistor pairs and said first power supply;
a second current mirror circuit connected between said second differential transistor pairs and said second power supply;
third and fourth differential transistor pairs having conductive types opposite to each other and having control electrodes connected to third and fourth input terminals, respectively;
third and fourth cons ant current sources connected to said third and fourth differential transistor pairs, respectively;

a third current mirror circuit connected between said third differential transistor pairs and said first power supply; and
a fourth current mirror circuit connected between said fourth differential transistor pairs and said second power supply, and
wherein said first output stage transistor is included in said first current mirror circuit, and
wherein said second output stage transistor is included in said fourth current mirror circuit, and
wherein said third output stage transistor is included in said third current mirror circuit and
wherein said fourth output stage transistor is included in said second current mirror circuit.

5. The semiconductor device according to claim 4, further comprising:
a current error compensation circuit compensating for errors of currents respectively flowing through said first and second output stage transistors at the time of said push-pull operation, in accordance with said output signal and a referential signal.

6. A charge pump circuit that is used in a PLL (Phase-Locked Loop) circuit, and generates a first output signal and a second output signal in which said first output signal is inverted, in response to an up instruction signal and a down instruction signal sent from a phase comparator to drive VCO (Voltage-Controlled Oscillator) in accordance with said first and second output signals, comprising:
first and second output stage transistors generating said first output signal as a result of a push-pull operation, said first and second output stage transistors being mutually connected in series between a first power supply and a second power supply;
third and fourth output stage transistors generating said second output signal as a result of a push-pull operation, said third and fourth output stage transistors being mutually connected in series between said first power supply and said second power supply;
first and second differential transistor pairs having conductive types opposite to each other and having control electrodes connected to first and second input terminals, respectively, to which said up instruction signal and an up instruction inversion signal are sent, wherein said up instruction signal is inverted;
first and second constant current sources connected to said first and second differential transistor pairs, respectively;
a first current mirror circuit connected between said first differential transistor pairs and said first power supply;
a second current mirror circuit connected between said second differential transistor pairs and said second power supply;
third and fourth differential transistor pairs having conductive types opposite to each other and having a control electrode connected to third and fourth input terminals, respectively, to which said down instruction signal and a down instruction inversion signal are sent, wherein said down instruction signal is inverted;
third and fourth constant current connected to said third and fourth differential transistor pairs, respectively;
a third current mirror circuit connected between said third differential transistor pairs and said first power supply; and
a fourth current mirror circuit connected between said fourth differential transistor pairs and said second power supply and wherein said first output stage transistor is included in said first current mirror circuit, and wherein said second output stage transistor is included in said fourth current mirror circuit, and wherein said third output stage transistor is included in said third current mirror circuit and wherein said fourth output stage transistor is included in said second current mirror circuit.

7. The charge pump circuit according to claim 6, further comprising:

a current error compensation circuit compensating for errors of currents flowing through said first to fourth mirror circuits, respectively.

8. The charge pump circuit according to claim 7 further comprising:

fifth and sixth constant current sources connected in parallel to said first and third constant current sources, respectively; and wherein said current mirror compensation circuit generates a control signal corresponding to a difference between a set signal and a signal indicative of an average value between said first and second output signals, and wherein said fifth an sixth constant current sources change values of currents to be sent to said first and third differential transistor pairs, in response to said control signal.

9. A PLL (Phase-Locked Loop) circuit, comprising:

a phase comparator;

a VCO (Voltage-Controlled Oscillator); and a charge pump circuit generating a first output signal and a second output signal in which said first output signal is inverted, in response to an up instruction signal and a down instruction signal sent from said phase comparator to drive said VCO in accordance with said first and second output signals, and wherein said charge pump circuit includes:

first and second output stage transistors generating said first output signal as a result of a push-pull operation, said first and second output stage transistors being mutually connected in series between a first power supply and a second power supply;

third and fourth output stage transistors generating said second output signal as a result of a push-pull operation, said third and fourth output stage transistors being mutually connected in series between said first power supply and said second power supply;

first and second differential transistor pairs having conductive types opposite to each other and having control electrodes connected to first and second input terminals, respectively, to which said up instruction signal and an up instruction inversion signal are sent, wherein said up instruction signal is inverted;

first and second constant current sources connected to said first and second differential transistor pairs, respectively;

a first current mirror circuit connected between said first differential transistor pairs and said first power supply;

a second current mirror circuit connected between said second differential transistor pairs and said second power supply;

third and fourth differential transistor pairs having conductive types opposite to each other and having control electrodes connected to third and fourth input terminals, respectively, to which said down instruction signal and a down instruction inversion signal are sent, wherein said down instruction signal is inverted;

third and fourth constant current sources connected to said third and fourth differential transistor pairs, respectively;

a third current mirror circuit connected between said third differential transistor pairs and said first power supply; and a fourth current mirror circuit connected between said fourth differential transistor pairs and said second power supply, and wherein said first output stage transistor is included in said first current mirror circuit, and wherein said second output stage transistor is included in said fourth current mirror circuit, and wherein said third output stage transistor is included in said third current mirror circuit and wherein said fourth output stage transistor is included in said second current mirror circuit.

10. The PLL circuit according to claim 9, further comprising:

a current error compensation circuit compensating for errors of currents flowing through said first to fourth mirror circuits, respectively.

* * * * *